… … …

United States Patent [19]
Yahata

[11] Patent Number: 5,812,497
[45] Date of Patent: Sep. 22, 1998

[54] HYBRID-SYNCHRONOUS TYPE CLOCK SYNCHRONIZING APPARATUS OF WHICH DOMINANT GAIN GREATER THAN SUM OF OTHER GAINS NETWORK THEREWITH, AND CLOCK SYNCHRONIZING METHOD THEREOF

[75] Inventor: Haruki Yahata, Tokyo, Japan

[73] Assignee: Kabushiki Kaisha Toshiba, Kanagawa-ken, Japan

[21] Appl. No.: 778,252

[22] Filed: Jan. 8, 1997

Related U.S. Application Data

[63] Continuation of Ser. No. 462,984, Jun. 5, 1995, Pat. No. 5,615,177.

[30] Foreign Application Priority Data

Jun. 8, 1994 [JP] Japan ................................ 6-126320

[51] Int. Cl.⁶ .......................... G04B 47/00; G04F 5/00; H04L 7/00
[52] U.S. Cl. ...................... 368/10; 368/46; 368/156; 375/356
[58] Field of Search ............................... 368/10, 46, 118, 368/155, 156; 370/100.1; 375/356–357; 340/825.2, 825.4, 825.54; 331/1, 3, 25

[56] References Cited

U.S. PATENT DOCUMENTS

| | | |
|---|---|---|
| 4,748,644 | 5/1988 | Silver et al. . |
| 5,062,724 | 11/1991 | Iizuka . |
| 5,327,425 | 7/1994 | Niwa et al. . |
| 5,422,915 | 6/1995 | Byers et al. . |
| 5,469,409 | 11/1995 | Anderson et al. . |
| 5,475,325 | 12/1995 | Nezu . |
| 5,475,717 | 12/1995 | Cordonnier et al. . |

OTHER PUBLICATIONS

D. Mitra, "Network Synchronization: Analysis of a Hybrid of Master–Slave and Mutual Synchronization," IEEE Transactions on Communication, vol. COM–28, No. 8 (Aug. 1980), pp. 1245–1259.

*Primary Examiner*—Vit W. Miska
*Attorney, Agent, or Firm*—Finnegan, Henderson, Farabow, Garrett & Dunner, L.L.P.

[57] ABSTRACT

A clock synchronizing apparatus is constructed of a multi-input PLL circuit. The multi-input PLL circuit comprises a phase comparator, a variable frequency oscillator, a loop filter, and an adding device. The phase comparator includes a plurality of subtracting devices for subtracting an output signal from each of input signals and a plurality of amplifiers for obtaining a phase comparison characteristic corresponding to the output signal of each subtracting device and for amplifying each phase comparison characteristic by a predetermined gain. Each gain is predetermined for each input signal. One dominant gain is greater than the sum of the other gains.

16 Claims, 5 Drawing Sheets

HYBRID-SYNCHRONOUS TYPE CLOCK SYNCHRONIZING APPARATUS OF WHICH DOMINANT GAIN GREATER THAN SUM OF OTHER GAINS NETWORK THEREWITH, AND CLOCK SYNCHRONIZING METHOD THEREOF

BACKGROUND OF THE INVENTION

This application is a continuation of application Ser. No. 08/462,984, filed Jun. 5, 1995, now U.S. Pat. No. 5,615,177.

1. Field of the Invention

The present invention relates to a clock synchronizing apparatus for synchronizing the clock of a closed communication network such as a LAN or a MAN with the clock of a wide area communication network, a network therewith, and a clock synchronizing method thereof.

2. Description of the Related Art

In recent years, as optical communications have become common, high speed digital transmissions have been employed for closed networks such as LANs and MANs. When a digital communication is made from a closed network to an external wide area digital network, the clock of the closed network should be synchronized with the clock of the external wide area digital network. Normally, since the closed network is connected to the wide area network as a subordinate system, the clock of the closed network is subordinately synchronized with the clock of the wide area network. In this case, clock synchronizing apparatuses should be disposed at a plurality of nodes of the closed network to maintain the reliability.

Even if clock synchronizing apparatuses are disposed at a plurality of nodes, the clock of the closed network is synchronized with the clock of the wide area network momentarily at only one node. When the clock synchronizing apparatus at the node fails to synchronize the clock with the clock of the wide area network, this clock synchronizing apparatus is switched to another clock synchronizing apparatus. At this point, complicated control signals should be exchanged between these clock synchronizing apparatuses. Thus, while the clock synchronizing apparatuses are being switched, a trouble such as loss-of-synchronization or out-of-synchronization may take place.

If the clocks of clock synchronizing apparatuses at a plurality of nodes can be synchronized with the clock of the wide area network, even if a synchronous input signal stops at one node, the network system is less affected. Thus, such a problem can be prevented. This technique is referred to as a hybrid synchronization. The hybrid synchronization causes the wide area network to subordinately synchronize the clock with the clocks at nodes in the closed network and each of the nodes to mutually synchronize the clock with those of the other nodes.

However, the operation of the hybrid synchronization has not been satisfactorily studied. Thus, details such as constants of the hybrid synchronization are unknown. Consequently, the hybrid synchronization has not been widely used although its advantages are well known.

SUMMARY OF THE INVENTION

An object of the present invention is to provide a clock synchronizing apparatus that accomplishes the hybrid synchronization, a network therewith, and a clock synchronizing method thereof.

More specifically, an object of the present invention is to provide a clock synchronizing apparatus that stably operates free of out-of-synchronization or the like, a network therewith, and a clock synchronizing method thereof.

To accomplish the object, the present invention is a clock synchronizing apparatus for inputting a plurality of input signals and for outputting one output signal that synchronizes with clocks of these input signals, comprising phase compare means for outputting the phase difference between the phase of each of the input signals and the phase of the output signal of the clock synchronizing apparatus; and amplification means for amplifying the output signals by predetermined gains, which a one gain thereof being greater than the sum of the other gains.

According to the present invention, when the clock of for example a closed network is subordinately synchronized with the clock of an external network as a wide area network. Each Node in the closed network mutually synchronize with the clocks of the other nodes. At this point, in a phase comparator, a dominant gain is greater than the sum of the other gains. In other words, when the hybrid synchronization is performed, since the range of gains of a PLL circuit is limited, clocks can be stably synchronized in the network free of out-of-synchronization or the like.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to the accompanying drawings, an embodiment of the present invention will be described.

Figure 1:
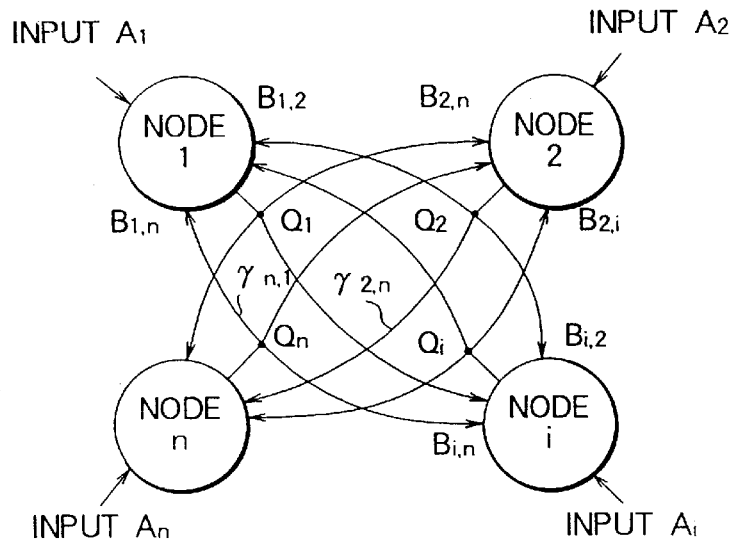
FIG. 1 is a schematic diagram showing a model of a clock synchronizing system of a network according to an embodiment of the present invention.

FIG. 1 is a schematic diagram showing a model of a clock synchronizing system of a network.

The network shown in FIG. 1 is a mesh type closed network including a plurality of nodes 1, 2, . . . , i, . . . , and n. The nodes 1, 2, . . . , i, . . . , and n input signals A1, A2, . . . , Ai, and An as clocks with the same frequency from an external wide area network. However, the phases of the clocks of the input signals A1, A2, . . . , Ai, . . . , and An are not always the same. In addition, there are delays in links that connect the nodes 1, 2, . . . , i, . . . , and n.

Figure 2:
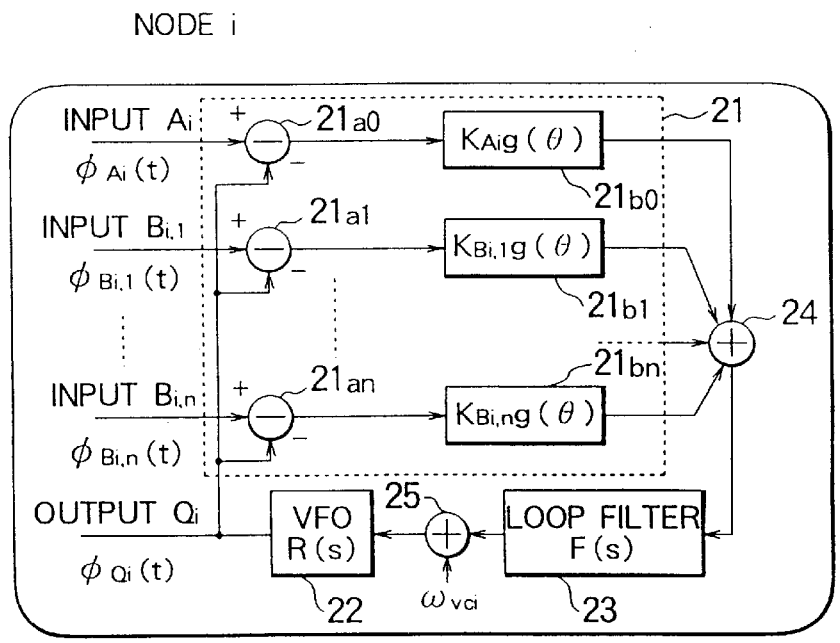
FIG. 2 is a block diagram showing the functional model of a multi-input phase locked loop (PLL) for use at a node of the network shown in FIG. 1.

FIG. 2 is a block diagram showing the functional model of the construction of a clock synchronizing apparatus for use at each node shown in FIG. 1.

As shown in FIG. 2, the clock synchronizing apparatus is constructed of a multi-input phase locked loop circuit (hereinafter referred to as the multi-input PLL circuit) as a functional mode. The multi-input PLL circuit inputs an input signal Ai from the external wide area network and signals Bi,1, Bi,2, ..., and Bi,n from the other nodes and outputs an output signal Qi as a clock. The multi-input PLL circuit (system) is constructed of a group of phase comparators 21, a variable frequency oscillator (VFO) 22, a loop-filter 23, and adding devices 24 and 25 as hardware.

However, since FIG. 2 is a block diagram showing a model of the apparatus, it does not always accord with the hardware of the multi-input PLL circuit. For example, phase comparators 21a and 21b may be integrally constructed as one phase comparator. In addition, the VFO 22 and the adding device 25 might be a VFO with a center angular frequency ωvci. Next, the multi-input PLL circuit will be described corresponding to the functional model. However, it should be noted that the real hardware of the multi-input PLL circuit may differ from the block diagram shown in FIG. 2.

The group of phase comparator 21 comprises a plurality of subtracting devices 21a0, 21a1, 21a2, ..., and 21an and a plurality of amplifiers 21b0, 21b1, 21b2, ..., and 21bn. The subtracting devices 21a0, 21a1, 21a2, ..., and 21an subtract the output signal Qi from the input signals Ai, Bi,1, Bi,2, and Bi,n, respectively. The amplifiers 21b0, 21b1, 21b2, ..., and 21bn convert the outputs of the subtracting devices 21a0, 21a1, 21a2, ..., and 21an corresponding to a phase comparison characteristic and amplify the converted output by a predetermined gain. According to the present invention, each gain is predetermined for each input signal. In addition, one dominant gain is greater than the sum of the other gains.

The adding device 24 adds all the output signals of the amplifiers 21b0, 21b1, 21b2, ..., and 21bn.

The loop filter 23 can be functionally categorized as a loop filter having a perfect integrating device and a loop filter having an imperfect integrating device. When the loop filter 23 has the perfect integrating device, the multi-input PLL circuit is treated as a 2nd order PLL circuit with perfect integrator. In contrast, when the loop filter 23 has the imperfect integrating device, the multi-input PLL circuit is treated as a 2nd order PLL circuit with imperfect integrator. If the loop filter has flat characteristic, the PLL is treated as a 1st order PLL.

The adding device 25 adds a signal with a predetermined frequency (center angular frequency ωvci) to the output signal of the loop filter 23.

The VFO 22 inputs the output signal of the adding device 25. The center angular frequency of the VFO 22 is ωvci. The VFO 22 can vary the oscillating frequency corresponding to the input signal. The output signal of the VFO 22 is an output signal Qi as a clock.

The node i inputs the input signal Ai as a clock from the external wide area network. The synchronous gain of the PLL corresponding to the input signal Ai is denoted by KAi. (The synchronous gain is obtained by excluding the DC gain of the loop filter from the loop gain.) In addition, the node i inputs an input signal Bi,j as a clock from another node j. The synchronous gain of this input signal is denoted by KBi,j. The input signal Ai that is input from the external wide area network is referred to as a subordinate synchronous input signal. The gain of the input signal is referred to as a subordinate synchronous gains. The input signal Bi,j that is input from another node is referred to as a mutual synchronous input signal. The gain of this input signal is referred to as a mutual synchronous gain. In FIG. 1, γj,i represents a phase shift due to a delay of a link from the node j to the node i When there is no link, the gain of the PLL is zero. Since the output signal of a node is not input to this node, KBi,i is "0". Thus, it is clear that when there are n nodes, the number of input signals of the PLL is at most n.

Since the clock of the wide area network is oscillated by one original oscillator, the phase φAi(t) of the input signal Ai that is input from the wide area network to the node i is expressed by the following equation.

$$\phi Ai(t) = \omega c t + \xi Ai \quad (1)$$

where ωc is the unified angular frequency of the wide area network.

The relation between the phase of each input signal and the phase of the output signal in a stable state of the multi-input PLL at the node i shown in FIG. 2 is expressed by the following equations (2) and (3).

$$\phi Bi,j(t) = \phi Ai(t) ''\lambda i,j \quad (2)$$

$$\phi Qi(t) = \phi Ai(t) - \delta i \quad (3)$$

In this case, the sum vi(t) of the input signals of the loop filter 23 (namely, the output signals of the group of the phase comparator 21) is expressed by the following equation.

$$vi(t) = KAi \cdot g(\delta i) + \sum_{j=1}^{n} KBi,j \cdot g(\delta i - \lambda i,j) \quad (4)$$

Next, the loop filter 23 having the perfect integrating device will be described. Thereafter, the PLL with imperfect integrator will be described with reference to the PLL with perfect integrator.

First, the case that the phase comparison characteristic of the network is in a sine wave shape will be described.

In this case, a sufficient condition of which a phase stable point is present irrespective of the phases of the input signals that are output from the wide area network and the phase shift due to the delay of the link should be obtained. In the stable state of the PLL with perfect integrator, the following relation is satisfied at any node.

$$vi(t) = 0 \quad (5)$$

In addition, due to the function of the phase control of the PLL circuit, the change of Vi(t) should be positive to the change of δi. Thus, this relation is expressed by the following expression.

$$d\{vi(t)\}/d\delta i \geq 0 \quad (6)$$

Since the phase characteristic is in a sine wave shape, the following equation is satisfied.

$$g(\theta) = \sin(\theta) \quad (7)$$

Next, a condition that satisfies the equation expressions (5) and (6) at any node should be obtained.

The relation between the differences of the phases of multiple input signals and the differences of the phases of input signals and output signals corresponding to the loop gain should be obtained.

Since the equation (4) represents the sum of sine waves, vi(t) is a sine wave that is the sum of vectors of sine wave components.

If the magnitude of a particular component of a sine wave is greater than the sum of the magnitudes of the other components, the vector of the maximum component is dominant regardless of the changes of the phases of the other components. The input signal with the maximum gain is referred to as a dominant input signal.

On the other hand, when the magnitude of any component is smaller than the sum of the magnitudes of the other components, any component is not dominant. Thus, the direction of the composite vector varies in any direction depending on the relative phase relation of each component.

Thus, corresponding to the magnitude of each component of the equation (4) (namely, the mutual relation of the magnitudes of the loop gains), the relation between $\delta i$ and $\lambda i,j$ in stable state will be described in the following three types (A), (B), and (C).

Type (A): In the case that a subordinate synchronous input signal is dominant.

$$KAi \geq \sum_{j=1}^{n} KBi,j \qquad (8)$$

In the equation (4), since the component of $\sin(\delta i)$ is dominant, when $\lambda 2$ varies in the positive slope portion of $KAi \sin(\delta i)$, a stable state that satisfies the expressions (5) and (6) is present. Thus, $\delta i$ varies in a range of $-\pi/2$ to $\pi/2$ at a period of $2\pi$ corresponding to the change of $\lambda i,j$ (where j=1 to n).

Type (B): In the case that one of mutual synchronous input signals is dominant.

$$KBi,k \geq KAi + \sum_{j=1, J \neq k}^{n} KBi,j \qquad (9)$$

At this point, in the equation (4), since the component of sine $(\delta i - \lambda i,k)$ is dominant, when $\lambda 2$ varies in the positive slope portion of $KBi,k \sin(\delta i - \lambda i,k)$ corresponding to the changes of phases other than $\lambda i,k$, a stable state is present. In other words, $\delta i$ varies in a width of $\pi$ at a period of $2\pi$ corresponding to the change of $\lambda i,k$ (where $j \neq k$).

Since the stable state is present in the positive slope portion even if the dominant input signal $\lambda i,k$ increases, $\delta i - \lambda i,k$ varies in a range of $-\pi/2$ to $\pi/2$ at a period of $2\pi$. In other words, $\delta i$ varies along a slope line with an angle of 45° on a $\lambda i,k \cdot \delta i$ coordinate plane corresponding to the change of $\lambda i,k$. Thus, if $\lambda i,k$ varies in a width of $2\pi$ at a period $2\pi$, $\delta i$ varies in a width of $2\pi$ at a period of $2\pi$ regardless of other input signals.

Type (C): In the case that any input signal of types A and B is not dominant.

Due to the relation of relative phases of all input signals, as $\lambda i,j$ increases, $\delta i$ increases or varies in a width of $\pi$ at a period of $2\pi$. When all $\lambda i,j$ vary in a width of $2\pi$ at a period of $2\pi$, $\delta i$ also varies in a width of $2\pi$ at a period of $2\pi$. However, one of $\lambda i,j$ continuously increases, it is not assured that $\delta i$ varies in a predetermined width. Depending on the relation of phases of other input signals, $\delta i$ continuously increases at the same time.

Figure 3:
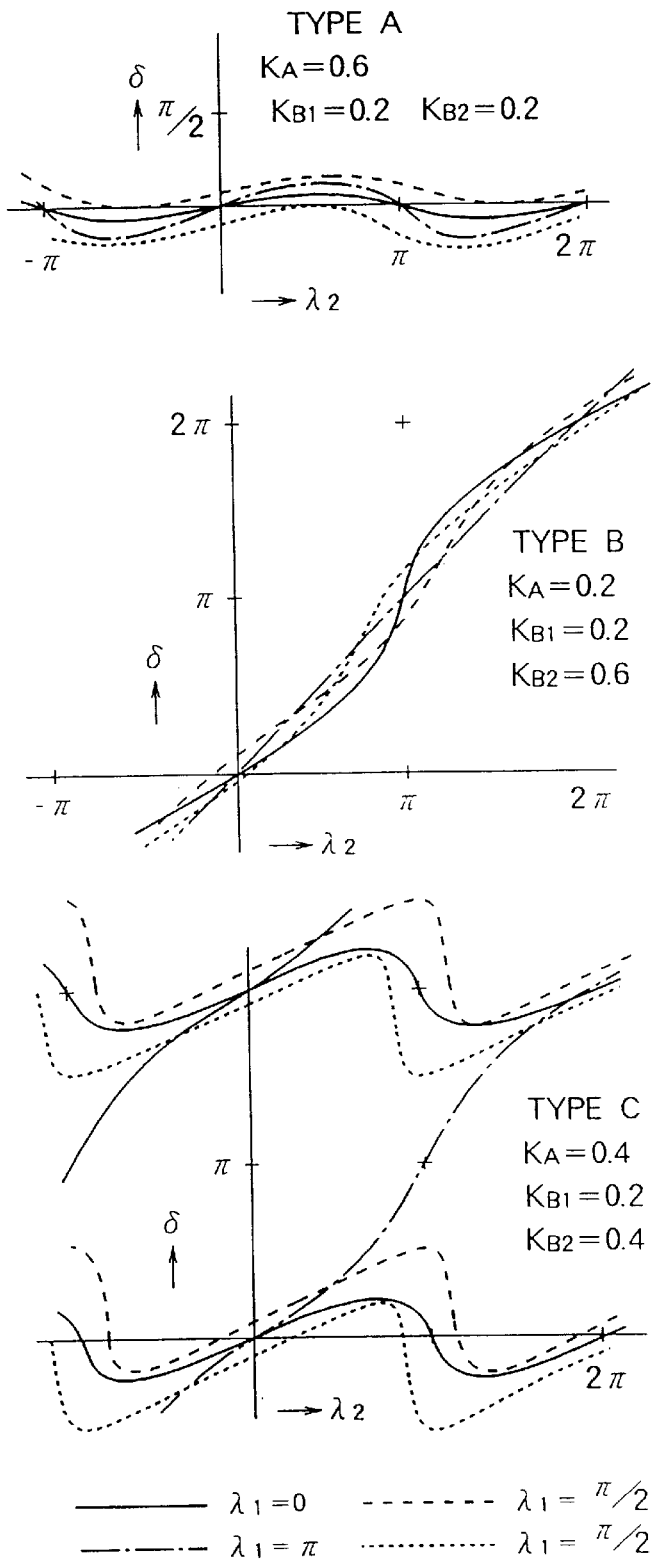
FIG. 3 is a graph for explaining characteristics of the PLL according to the present invention.

Next, with reference to FIG. 3, the case that there are a subordinate synchronous input signal and two mutual synchronous input signals in the multi-input PLL circuit (namely three-input PLL circuit) will be described. FIG. 3 is a graph showing the relation between the differences of phases of input signals and the differences of phases of input signals and output signals in stable state of the three-input PLL circuit.

As shown in FIG. 3, in the case of the type (C), it is clear that the relation between the differences of phases of input signals and output signals remarkably varies due to the differences of phases of input signals.

It is determined whether or not a stable phase relation is present in a mesh network. In FIG. 1, one link connected to for example node 1 is disconnected between for example Bi,n and Qn so as to see the change of the relative phase $\delta n'=\delta n+\xi A1=\xi An$ of the Qn output signal corresponding to the relative phase $\lambda 1,n$ of the B1,n input signal.

The relative phase $\delta n'$ is expressed by the following equation.

$$\delta n'=ph(\lambda 1,n) \qquad (10)$$

When Qn and B1,n is connected with a link, due to a phase shift $\gamma n,1$, the following equation is satisfied.

$$\lambda 1,n=\delta n'+\gamma n,1 \qquad (11)$$

If there are $\lambda 1,n$ and $\delta n'$ that satisfy the equations (10) and (11) regardless of $\xi Ai$ and $\gamma j,i$, there is a phase stable point of the system. Since the equation (11) is represented by a straight line with a slope of 45°, a condition of which the straight line always intersects with the line represented by the equation (10) should be obtained.

If $\delta n'$ continuously and periodically vary in a predetermined range corresponding to the change of $\lambda 1,n$, since the line represented by the equation (10) always intersects with the line represented by the equation (11), a phase stable point is sufficiently present.

Thus, if the phase of a link that is disconnected is varied in any manner and the change of the phase of the signal returned to the link through the network is continuous in a predetermined range, it is clear that the system is sufficiently stable.

To sufficiently satisfy this condition, the following steps are performed.

(S1) All type A nodes are treated as "good synchronous nodes". Links on the output side of the type A nodes are treated as "good synchronous links".

(S2) Type B nodes of which dominant input signals are "good synchronous links" and links on the output side thereof are treated as "good synchronous nodes" and "good synchronous links", respectively.

(S3) Type C nodes of which all input signals from other nodes are "good synchronous links" and links on the output side thereof are treated as "good synchronous nodes" and "good synchronous links", respectively.

(S4) (S2) and (S3) are repeated.

After these steps, when all nodes are "good synchronous nodes", if any link is disconnected, the change of the phase of a signal returned to the link through the network corresponding to the change of the phase of the link is continuous in a predetermined range and thereby a stable phase of the system is sufficiently present.

The above-description is logically true. However, in the type (C), even in unstable state, the sum of vectors of a plurality of components may be almost zero. In such a state, although there is a stable point, a total gain that is converged to a stable point is very small. In addition, as is clear from the graph showing the type (C), a small change of the phase of an input signal results in a large change of the phase of an output signal. Thus, it is not preferable to cause a type C node to be present in the system.

At type A and B nodes, if the relation of the magnitudes of gains is close to the equations (8) and (9), since the total gain may be almost "0", it is hardly converted to a stable point.

Next, the case that a triangular shape phase characteristic will be described.

In this case, the equations (5) and (6) should be satisfied at any node.

When the phase characteristic is in an isosceles triangle shape, the peak value of the phase comparison characteristic is normalized to "1".

$$(2m-0.5)\pi \leq \theta \leq (2m+0.5)\pi : g(\theta) = 0.5(\theta - 2m\pi)/\pi \quad (12a)$$

$$(2m+0.5)\pi < \theta < (2m+1.5)\pi : g(\theta) = -0.5\{\theta - (2m+1)\pi\}/\pi \quad (12b)$$

Since the peak value is "1" as with the case of the sine wave shape phase characteristic, the gain (slope) of this characteristic is $0.5\pi$. Thus, it should be notated that the real gain in the case of the triangular shape phase characteristic is $0.5\pi$ times the synchronous gain.

Next, the relation between the differences of phases of multiple input signals and the differences of phases of input signals and output signals will be described corresponding to the change of the synchronous gain.

As with the case of the above-described sine wave shape phase characteristic, the relation between $\lambda i,j$ and $\delta i$ will be described in the following three types (A), (B), and (C) corresponding to the mutual relation of the magnitude of the components of the equation (4) (namely, the mutual relation of the magnitudes of the synchronous gains).

Type (A): In the case that a subordinate synchronous input signal is dominant (namely, in the case that the equation (8) is satisfied).

In the equation (4), since the component of $g(\delta i)$ is dominant, when $\gamma 2$ varies in the positive slope portion of $KAi \cdot g(\delta i)$, a stable state that satisfies the expressions (5) and (6) is present. Thus, $\delta i$ varies in a range of $-\pi/2$ and $\pi/2$ at a period of $2\pi$ corresponding to the change of $\lambda i,j$ (where $j=1$ to $n$).

Type (B): In the case that one of mutual synchronous input signals is dominant (namely, in the case that the equation (9) is satisfied).

At this point, in the equation (4), since the component of $g(\delta i - \lambda i,k)$ is dominant, when $\lambda 2$ varies in the positive slope portion of $KBi,k \cdot g(\delta i - \lambda i,k)$ corresponding to the changes of phases other than $\lambda i,k$, a stable state is present. In other words, $\delta i$ varies in a width of $\pi$ at a period of $2\pi$ corresponding to the change of $\lambda i,k$ (where $j \neq k$).

Since the stable state is present in the positive slope portion even if the phase of the dominant input signal $\lambda i,k$ increases, $\delta i - \lambda i,k$ varies in a range of $-\pi/2$ to $\pi/2$ at a period of $2\pi$. In other words, $\delta i$ varies along a slope line with an angle of $45°$ on a $\lambda i,k \cdot \delta i$ coordinate plane corresponding to the change of $\lambda i,k$. Thus, if $\pi i,k$ varies in a width of $2\pi$ at a period $2\pi$, $\delta i$ varies in a width of $2\pi$ at a period of $2\pi$ regardless of other input signals.

Type (C): In the case that any input signal of categories A and B is not dominant.

The characteristic of this type is remarkably different from the type (C) of the sine wave shape phase characteristic. To determine the change of $\delta i$ corresponding to the phase of an input signal $\lambda i,k$, with $\lambda i,k$ (where j and k are constants and $j \neq k$), the right side of the equation (4) is divided into two terms. Thus, $$vis (\delta i, \lambda i,k) = KBi,k \cdot g(\delta i - \delta i,k) \quad (13)$$

$$vic(\delta i) = KAi \cdot g(\delta i) + \sum_{j=1, j \neq k}^{n} KBi,j \cdot g(\delta i - \lambda i,j) \quad (14)$$

In addition, since any component is not dominant, the following expression is satisfied.

$$KBi,k < KAi + \sum_{j=1, j \neq k}^{n} KBi,j \quad (15)$$

Thus, in a region where the magnitude of the composite characteristics of the equation (14) is smaller than a peak value $KBi,k$ of the equation (13), there may be a portion of which the slope of the region is greater than a slope $2KBi,k/\pi$. Both edges of this portion of the negative slope are denoted by points $p1(\delta i1, vic1)$ and $p2(\delta i2, vic2)$. Thus, the following expression is satisfied.

$$-(vic1 - vic2)/(\delta i1 - \delta i2) > 2KBi,k/\pi \quad (16)$$

A stable relative output phase $\delta i$ with $\lambda i,k$ is expressed by the following equation.

$$vis(\delta i, \lambda i,k) + vic(\delta i) = 0 \quad (17)$$

In addition, the resultant slope of the points p1 and p2 should be positive. Thus, when the line represented by the equation (14) is present between the points p1 and p2, since the resultant slope is not positive, there is no stable phase.

Since a stable phase corresponding to the point $p1(\delta i1, vic1)$ should satisfy the equation (17), an input phase difference $\lambda i,k1$ is expressed by the following equation.

$$\lambda i,k1 = \delta i1 + vic1\pi/2KBi,k \quad (18a)$$

Likewise, a phase difference corresponding to the point $p2(\delta i2, vic2)$ is expressed by the following equation.

$$\lambda i,k2 = \delta i2 + vic2\pi/2KBi,k \quad (18b)$$

Since the equations (13) and (14) are functions with respect to a period of $2\pi$, a point $p3(\delta i2 - 2\pi, vic2)$ is also present on the line represented by the equation (14).

An input phase difference $\lambda i,k3$ at the corresponding phase stable point is expressed by the following equation.

$$\lambda i,k3 = \lambda i,k2 - 2\pi \quad (18c)$$

Figure 4A:
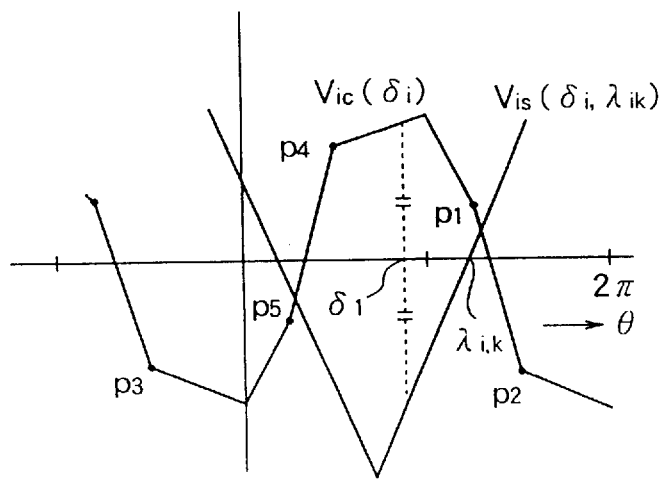
FIGS. 4A and 4B are graphs for explaining characteristics of the PLL according to the present invention.
Figure 4B:
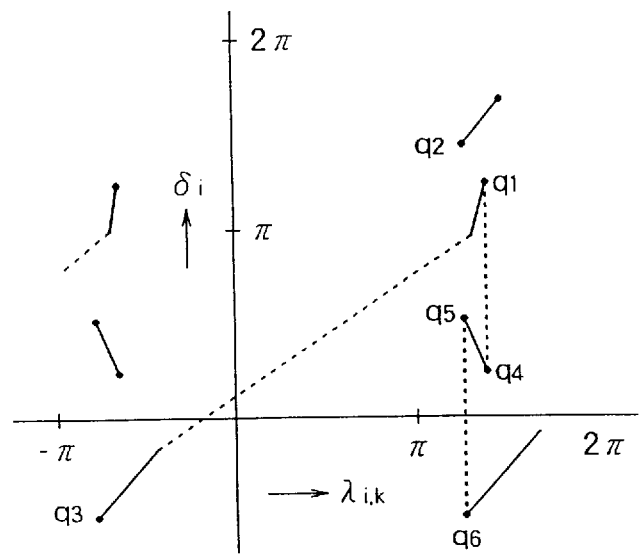

The relation between the differences of phases of input signals at the points p1, p2, and p3 and the differences of phases of input signals and output signals is represented by points q1, q2, and q3 on a $\lambda i,k \cdot \delta i$ coordinate plane shown in FIG. 4(B). A phase stable point corresponding to a point on the line represented by the expression (14) that connects the points p3 and p1 depends on the shape of two points (namely, the points p1 and p3) of the graph shown in FIG. 4(A). When the peak value on the line represented by the equation (14) is smaller than $KBi,k$ and a portion greater than $2KBi,k/\pi$ with a negative slope is not present outside the above-described portion, the points q3 and q1 shown in FIG. 4(B) are connected.

On the other hand, a stable state is present in a combination of a positive slope connecting the point $p4(\delta i1 - \pi, -vic1)$ and the point $p5(\delta i2 - \pi, -vic2)$ that are spaced apart from the points p1 and p2 shown in FIG. 4(B) by $\pi$ and a negative slope represented by the equation (13). The phase stable points q4 and q5 corresponding to the points p4 and p5 are $(\lambda i,k1, \delta i1 - \pi)$, $(\lambda i,k2, \delta i2 - \pi)$ on the $\lambda i,k \cdot \delta i$ coordinate plane. This graph is a periodic function at a period of $2\pi$ with respect to the $\lambda i,k$ axis and the $\delta i$ axis. The relation between the differences of phases of input signals and the differences of phases of input signals and output signals in stable state is as shown in FIG. 4(B) in which there is a gap in the graph.

Next, it is determined whether or not the graph has a gap against a line with a slope of $45°$.

When the slope connecting the point $q6(\lambda i,k2, \delta i2 - 2\pi)$ and the point $q4(\lambda i,k1, \delta i1 - \pi)$ is $45°$ or greater, the graph may have a gap against a line with a slope of $45°$.

The slope Gr connecting the two points is expressed by the following equation.

$$Gr = (\delta i1 - \pi - \delta i2 + 2\pi)/(\lambda i, k1 - \lambda i, k2) \quad (19)$$
$$= (\delta i1 - \delta i2 + \pi)/$$
$$\{\delta i1 - \delta i2 + (vic1 - vic2)\pi/2KBi,k\} > 1$$

This is because $$(vic1-vic2)<2KBi,k \quad (20)$$

Thus, in the case of the type (C), the graph has a gap against a line with a slope of 45°.

Next, with reference to FIG. 5, the relation between differences of phases of input signals and differences of phases of input signals and output signals in stable state of a three-input PLL circuit will be described.

In this case, as described above, a link is disconnected and the phase thereof is continuously varied. It is determined whether or not a stable state is always present corresponding to the change of the phase that is returned to the link. When the change of phase that is returned through the network is continuous in a predetermined range, it can be said that a stable state is sufficiently present.

Figure 5:
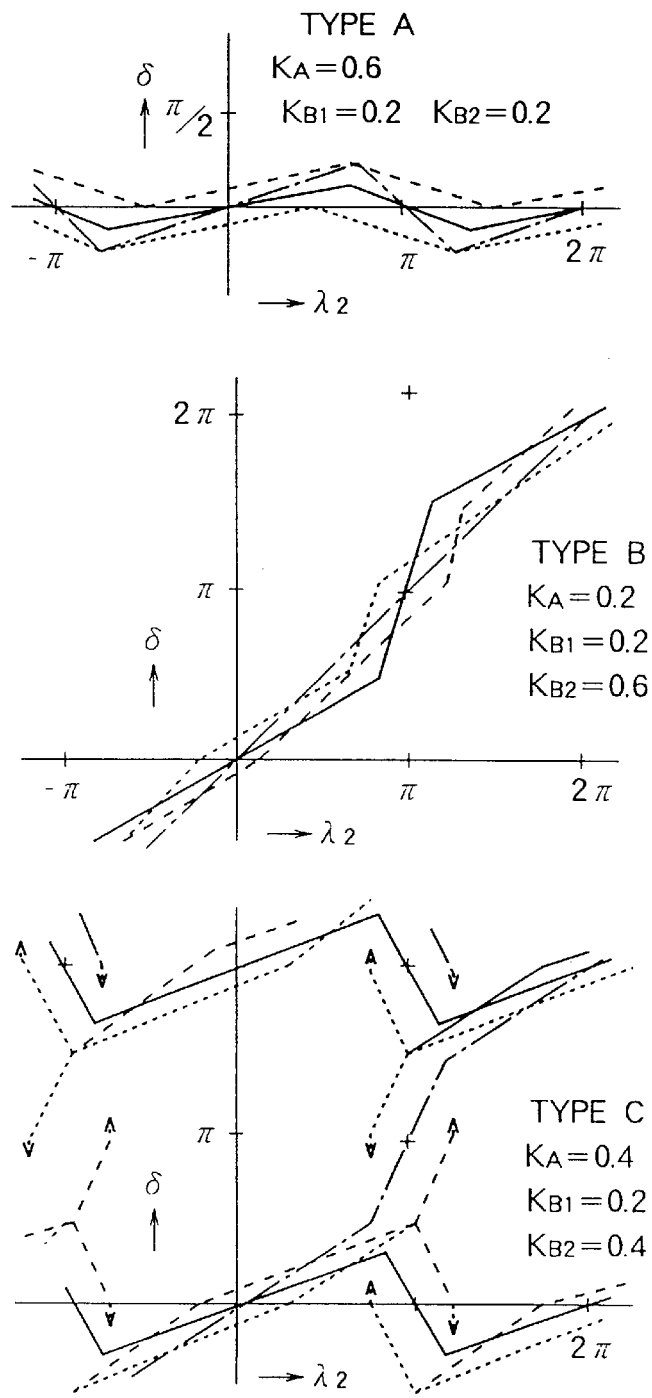
FIG. 5 is a graph for explaining characteristics of the PLL according to the present invention.

As shown in FIG. 5, to allow a phase stable point to be sufficiently present, as a sufficient condition, a type C node is not present in the network. This is because the line represented by the equation (10) does not intersect with the line represented by the equation (11). In addition, even in a stable state, a slight change of the phase of an input signal may cause the phase of an output signal to be jumped. This adversely affects the stable operation of the system. This feature is different from the case of the sine wave shape phase comparison characteristic. Of course, the absence of a type C node is not a necessary condition.

Thus, as with the case of the sine wave shape phase comparison characteristic, the following steps are performed.

(S1) It is determined that there is no a type C node in the network.

(S2) All type A nodes are treated as "good synchronous nodes". Links on the output side of the type A nodes are treated as "good synchronous links".

(S3) Type B nodes of which dominant input signals are "good synchronous links" and links on the output sides thereof are treated as "good synchronous nodes" and "good synchronous links", respectively.

(S4) (S3) is repeated.

After these steps, when all nodes are "good synchronous nodes", since the change of a phase of a signal returned to a link that is disconnected through the network is continuously in a predetermined range, a phase stable point is sufficiently present in the system.

Next, the PLL with the imperfect integrator (1st order PLL is contained also.) will be described.

As described above, an imperfect integrating device is used as the loop filter 23. The transfer functions of the loop filter 23 and the VFO 22 are expressed by the following equations.

$$F(s)=(s+a)/(s+b) \quad (21)$$

$$R(s)=1/s \quad (22)$$

In the stable state, due to the characteristic of the PLL with the imperfect integrator, the following equation is satisfied.

$$\omega c = \omega vci + vi(t) \cdot F(0) \quad (23)$$

In other words, $$vi(t) = KAi \cdot g(\delta i) + \sum_{j=1}^{n} KBi,j \cdot g(\delta i - \lambda i,j) \quad (24)$$
$$= (\omega c - \omega vci) \cdot b/a$$

For convenience, $$(\omega c - \omega vci) \cdot b/a = kvci \cdot Ksi \quad (25)$$

where $$Ksi = KAi + \sum_{j=1}^{n} KBi,j \quad (26)$$

Since $Ksi \cdot a/b$ is in a synchronous hold range (angular frequency) of which the phases of all input signals are the same, it can be said that kvci is the ratio of the difference between an input signal and a center angular frequency of the PLL circuit to the synchronous hold range (frequency).

Because of the equations (24) and (25), $$KAi \cdot g(\delta i) + \sum_{j=1}^{n} KBi,j \cdot g(\delta i - \lambda i,j) \quad (27)$$
$$= kvci \cdot Ksi$$

Assuming that the phase comparison characteristic $g(\theta)$ is normalized so that its maximum value and minimum value become 1 and −1, namely, $$-1 \leq g(\theta) \leq 1 \quad (28)$$

a condition for a gain of which δi that satisfies the equation (27) for any value of λi,j is present is obtained.

In the case of the type A, when the phase of the Ai input signal is the reverse of the phases of all the Bi,j input signals, the width of the change of the DC component of the first term on the left side of the equation (24) becomes minimum. Thus, the condition of the gain is expressed by the following equation.

$$KAi - \sum_{j=1}^{n} Ksi,j = 2KAi - Ksi \geq |kvci| \cdot Ksi \quad (29)$$

Thus, the condition for the gain is given by the following expression.

$$KAi \geq Ksi(1+|kvci|)/2 \quad (30)$$

A node that satisfies the expression (30) is referred to as an AN type node.

Likewise, a condition for a B type node is given by the following expression.

$$KBi,k \geq Ksi(1+|kvci|)/2 \quad (31)$$

A node that satisfies the expression (31) is referred to as a BN type node.

A node other than an AN type node and a BN type node is referred to as a CN type.

As with the above-described cases, the following steps are performed.

(S1) It is determined that there is no CN type node in the network.

(S2) All AN type nodes are treated as "good synchronous nodes". Links on the output side of the AN type nodes ar treated as "good synchronous links".

(S3) BN type nodes of which dominant input signals are "good synchronous links" and links on the output side thereof are treated as "good synchronous nodes" and "good synchronous links", respectively.

(S4) (S3) is repeated.

After these steps, when all nodes are "good synchronous nodes", a phase stable is sufficiently present.

On the other hand, in the case of a digital type PLL circuit or the like, the transfer functions of the loop filter 23 and the VFO 22 are expressed by the following equations.

$$F(z)=\{1-(1-ad)z-1\}/\{1-(1-bd)z-1\} \quad (34)$$

where $$1 \geq ad \geq 0, \ 1 \geq bd \geq 0 \ R(z)=z-1/(1-z-1) \quad (35)$$

Thus, ad and bd are used instead of a and b that are used for analog type. In the PLL with the perfect integrator, bd=0. In addition, the frequencies are normalized into a sampling frequency.

These conditions are summarized as follows.

The AN type, the BN type, and the CN type corresponding to the equations (30) and (31) are categorized for the PLL with the perfect integrator. However, in the PLL with the imperfect integrator, since b=0, the following expression is satisfied.

$$kvci=0 \quad (37)$$

Thus, it is clear that the AN type, the BN type, and the CN type includes the A type, the B type, and the C type that are used in the PLL with the perfect integrator, respectively. Consequently, it is necessary to consider only the AN type, the BN type, and the CN type.

For example, the CN type (C type) is valid only for the sine wave shape phase comparison characteristic of the PLL with the perfect integrator. In this case, when there is a CN type node, even if there is a phase stable point, it takes a very long time for convergence. Thus, it can be said that as a sufficient condition for the phase stable point, the absence of a CN type node is required. Thus, in the clock synchronizing system of the mesh network, the following steps are performed.

(S1) It is determined that there is no CN type node.

(S2) All AN type nodes are treated as "good synchronous nodes". Links on the output side of the AN type nodes are treated as "good synchronous links".

(S3) BN type nodes of which dominant input signals are "good synchronous links" and links on the output side thereof are treated as "good synchronous nodes" and "good synchronous links", respectively.

(S4) (S3) is repeated.

After these steps, when all nodes are "good synchronous nodes", a phase stable point is sufficiently present in the system.

Thus, it should be noted that an AN type node can be located by tracing back nodes from a BN node through dominant input signals. Consequently, the criterion of designing connections of a clock synchronizing system can be obtained.

Even if one of a plurality of clock synchronizing system gets defective (namely, one point defect takes place), at least clock synchronization should be maintained.

There may be following causes of a clock synchronous defect.

(A) The clock of the wide area network is disconnected at one node.

(B) One link is disconnected.

(C) One node gets defective and the node is disconnected from the clock system.

The case (C) is equivalent to the case that all links that are output from the defective node are disconnected.

When such a situation takes place, even if the node is not disconnected from the clock system and thereby a signal with a frequency that deviates from the clock of the system is continuously output, the effect should be as small as possible.

Thus, from reliability point of view, the following items should be considered.

1) When an input signal Ai is disconnected at an AN type node or an input signal Bi,k is disconnected at a BN type node, the disconnected node should not become a CN type node. Assuming that the maximum gain is "0", a gain that satisfies the equation (30) or (31) should be selected corresponding to a new maximum gain.

When the number of input signals of a node is large, the reliability may deteriorate. Unless the magnitudes and order of gains are properly designated, a CN type node may take place.

Normally, for one point defect, only two input signals are required.

When gains KAi and KBi,j for input signals at a node i are arranged in the ascending order, an L-th greatest gain KiL is expressed by the following equation.

$$KiL = \alpha iL \cdot Ksi$$

where the condition of aiL is given by the following expression.

$$\alpha iL \geq 0.5 \left\{ \left( 1 - \sum_{r=1}^{L-1} \alpha ir \right) + |kvci| \right\}$$

where r is a natural number; and when L is "1", the sum Σ is "0".

2) To reduce the effect of a defective node, the number of nodes that input clocks should be as small as possible (preferably, two or less).

3) It is not advantageous that a node that inputs a clock from the wide area network is a BN type node. A BN type node is easily affected by other nodes. A node that inputs a clock from the wide area network should be an AN type link.

Next, with reference to FIG. 6, another embodiment of the present invention will be described.

Figure 6:
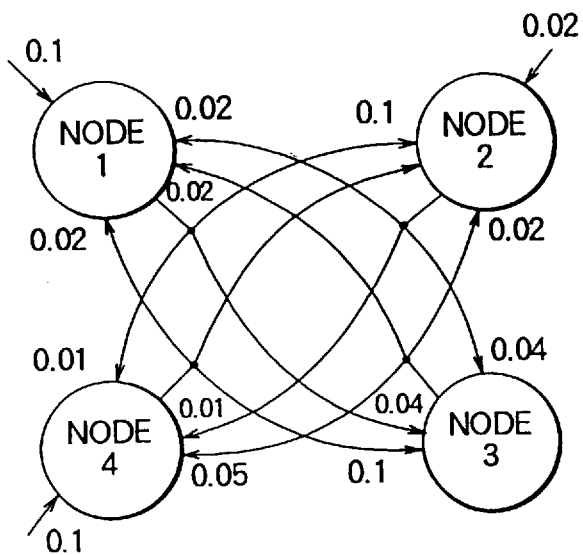
FIG. 6 is a graph for explaining advantages of the PLL according to the present invention.

FIG. 6 is a schematic diagram showing a clock synchronizing system of a network according to another embodiment of the present invention.

In FIG. 6, reference numerals 1 to 4 are nodes. Numerals of input signals of the nodes 1 to 4 represent gains of the input signals.

In this case, if |kvci| is around 0.1, the nodes 1 and 4, are AN type nodes. The nodes 2 and 3 are BN type nodes. The node 2 dominantly inputs a "good synchronous link" from the node 1. The node 3 dominantly inputs a "good synchronous link" from the node 4. Thus, the nodes 3 and 4 are "good synchronous nodes". Consequently, the clock synchronous system of the network becomes stable.

However, when an input signal from the wide area network to the node 1 is stopped, the node 1 becomes a CN type node. Thus, the clock system of the network may become unstable. This is because each node inputs many input signals and the magnitudes of the gains are not properly arranged.

Next, with reference to FIG. 7, another embodiment of the present invention will be described.

Figure 7:
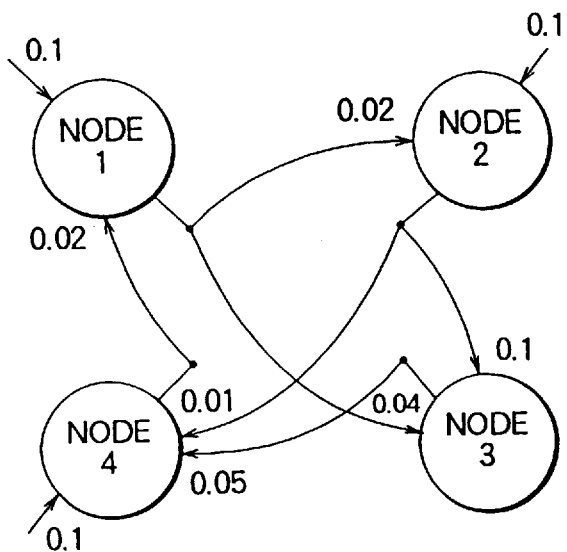
FIG. 7 is a graph for explaining the advantages of the PLL according to the present invention.

FIG. 7 is a schematic diagram showing a clock synchronizing system of a network according to another embodiment of the present invention.

In FIG. 7, nodes 1, 2, and 4 are AN type nodes. Node 3 is a B type node.

In this case, even if any input signal from the wide area network is stopped or any link is disconnected, each node is an AN type node or a BN type node. Thus, it is clear that the clock synchronizing system of the network is still stable. Since the node 4 inputs three input signals and the gains thereof are arranged, even if two input signals are disconnected, the synchronizing operation is not affected.

According to the present invention, a multi-input phase locked loop circuit that subordinately synchronizes the clock of each node in a closed network with the clock of an external network and mutually synchronizes the clock of each node with the clock of the other nodes in the closed network in the relation that the gain of a dominant input signal is satisfactorily greater than the sum of the gains of the other input signals is used. Thus, a clock synchronizing system that connects the closed network to the wide area network as its subordinate system can be accomplished free of out-of-synchronization or the like.

In addition, since a multi-input PLL circuit of which an L-th greatest gain is satisfactorily greater than the sum of an (L+1)-th greatest gain to the least gain is disposed at each node. Thus, even if an input signal with one of the greatest gain to the L-th greatest gain is lost, since a stable point is present, the reliability of the clock synchronization can be highly maintained.

Moreover, since a node with a clock that is synchronized with a clock of the external network has an input signal with the greatest gain from the external network, the effect of the other nodes can be reduced, thereby stably operating the system.

Furthermore, the number of clocks that are input to one node is at most three at the same time. Thus, when each node inputs many input signals, since it is not necessary to select: gains, a clock synchronizing system can be simply constructed with high reliability.

The clock synchronizing system is designed so that when a dominant input signal is an output signal of another node, the dominant input signal of the said another node is an input signal from the external network. In addition, the clock synchronizing system is designed so that when such requirement is not satisfied, a node that inputs an input signal from the external network is located by tracing back nodes that inputs dominant input signals as clocks. Thus, a clock synchronizing system that connects the closed network to the wide area network as a subordinate system can be accomplished with much higher reliability than that of the related art reference free of out-of-synchronization or the like.

Consequently, the reliability of a communication network that is synchronized with a clock can be improved.

As described above, according to the present invention, a clock system that connects a closed network to a wide area network as a subordinate system can be accomplished with much higher reliability than that of the related art reference free of out-of-synchronization or the like. As a result, the reliability of the communication network using the clock system can be improved.

In the above description, the present invention is applied for the mesh type network. However, the present invention can be also applied for a ring type network or the like.

In addition, the clock synchronizing apparatus according to the present invention can be applied for a TDMA type mobile communication system that requires frame synchronization among a plurality of ground base stations along with a system such as LAN.

Although the present invention has been shown and described with respect to best mode embodiments thereof, it should be understood by those skilled in the art that the foregoing and various other changes, omissions, and additions in the form and detail thereof maybe made therein without departing from the spirit and scope of the present invention.

What is claimed is:

1. A clock synchronizing apparatus for inputting a first input signal and a second input signal, and for outputting a synchronous signal that synchronizes with a first clock of the first input signal and a second clock of the second input signal, the apparatus comprising:

phase compare means for determining the phase differences between the phase of each of the first and second input signals and the phase of the synchronous signal and producing a first output signal and a second output signal corresponding to the respective phase differences; and amplification means for amplifying the first output signal by a first gain to produce a first amplified signal and the second output signal by a second gain to produce a second amplified signal, the first gain being greater than the second gain.

2. The clock synchronizing apparatus as set forth in claim 1, the apparatus further comprising;

means for adding the first and second amplified signals from said amplification means;

a loop filter responsive to said adding means to produce a filtered output signal; and oscillating means adding a signal of a predetermined frequency and the filtered output signal of said loop filter for outputting said synchronous signal with a variable frequency.

3. The clock synchronizing apparatus as set forth in claim 1, wherein the first gain is substantially greater than the second gain.

4. A net work having a plurality of nodes, each of the nodes having a clock synchronizing apparatus, each clock synchronizing apparatus for inputting a first input signal and at second input signal, and for outputting a synchronous signal that synchronizes with a first clock of the first input signal and a second clock of the second input signal, at least a first one of said nodes inputting the first input signal from an external network, each of said clock synchronizing apparatuses comprising:

phase compare means for determining the phase differences between the phase of each of the first and second input signals and the phase of the synchronous signal and producing a first output signal and a second output signal corresponding to the respective phase differences; and amplification means for amplifying the first output signal by a first gain to produce a first amplified signal and the second output signal by a second gain to produce a second amplified signal, the first gain being greater than the second gain.

5. The network as set forth in claim 4, wherein each of said clock synchronizing apparatuses further comprises:

means for adding the first and second amplified signals from said amplification means;

a loop filter responsive to said adding means to produce a filtered output signal; and oscillating means adding a signal of a predetermined frequency and the filtered output signal of said loop filter for outputting said synchronous signal with a variable frequency.

6. The network as set forth in claim 4, wherein the first gain is substantially greater than the second gain.

7. The network as set forth in claim 4, wherein said first node that has the first input signal from the external network is adapted for giving the synchronous signal outputted from said first node to a second one of said nodes as the first input signal of said second node.

8. The network as set forth in claim 4, wherein said second node that does not receive the first input signal from the external network receives the respective first input signal from said first node that receives the first input signal from the external network.

9. The network as set forth in claim 4, wherein, in the case that there is a said node for giving the respective first gain to the respective signal as a clock from the external network, if another said node does not give the respective first gain to the respective first input signal as a clock from the external network, then said plurality of nodes are traced back so as to locate a particular said node giving the respective first gain to the respective first input signal as a clock from the external network.

10. A closed network having a plurality of nodes, each of said nodes having a clock synchronizing apparatus, each of said clock synchronizing apparatuses arranged for inputting a first input signal and a second input signal, and for outputting a synchronous signal that synchronizes with a first clock of the first input signal and a second clock of the second input signal, at least one of said nodes inputting the first input signal subordinately in synchronization with an external wide area network, each of said clock synchronizing apparatuses comprising:

phase compare means for determining the phase differences between the phase of each of the first and second input signals and the phase of the synchronous signal and producing a first output signal and a second output signal corresponding to the respective phase differences; and amplification means for amplifying the first output signal by a first gain to produce a first amplified signal and the second output signal by a second gain to produce a second amplified signal, the first gain being greater than the second gain.

11. The closed network as set forth in claim 10, wherein each of said clock synchronizing apparatuses further comprises:

means for adding the first and second amplified signals from said amplification means to produce an output signal;

a loop filter inputting the output signal of said adding means to produce a filtered signal; and oscillating means adding the filtered signal and a signal with a predetermined frequency for outputting said synchronous signal with a frequency affected by the adding.

12. The closed network as set forth in claim 10, wherein the first gain is substantially greater than the second gain.

13. The closed network as set forth in claim 10, wherein a first said node that has the respective first input signal from the external wide area network is adapted for giving the synchronous signal output from the first said node to a second said node as the first input signal of the second node.

14. The closed network as set forth in claim 10 wherein the plurality of nodes are arranged to provide the respective first input signal of a second said node that does not receive the first input signal from the external wide area network is derived from the said first input signal of a first said node that has the first input signal from the external wide area network.

15. A clock synchronizing method for a network having a plurality of nodes, each of said nodes having a clock synchronizing apparatus, each of the clock synchronizing apparatuses for inputting a first input signal and a second input signal, and for outputting a synchronous signal that synchronizes with a first clock of the first input signal and a second clock of the second input signal, at least one of said nodes inputting the first input signal from an external network, the method comprising the steps of:

determining the phase differences between the phase of each of the first and second input signals and the phase of the synchronous signal and producing a first output signal and a second output signal, each corresponding to a respective one of the phase differences; and amplifying the first output signal by a first gain and the second output signal by a second gain, the first gain being greater than the second gain.

16. The method as set forth in claim 15, the method further comprising the steps of:

adding the amplified results;

filtering the added result with a loop filter;

adding a signal with a predetermined frequency to the filtered result; and treating the predetermined frequency as a center frequency and generating the synchronous signal with a frequency deviation from the center frequency corresponding to the result of the second adding step.

* * * * *